(12) United States Patent
Yamamoto (10) Patent No.: US 12,108,583 B2
(45) Date of Patent: Oct. 1, 2024

(54) ELECTROMAGNETIC SHIELDING MATERIAL

(71) Applicant: JX Nippon Mining & Metals Corporation, Tokyo (JP)

(72) Inventor: Yukito Yamamoto, Ibaraki (JP)

(73) Assignee: JX Advanced Metals Corporation, Tokyo (JP)

(*) Notice: Subject to any disclaimer, the term of this patent is extended or adjusted under 35 U.S.C. 154(b) by 0 days.

(21) Appl. No.: 18/265,771

(22) PCT Filed: Sep. 28, 2021

(86) PCT No.: PCT/JP2021/035726
§ 371 (c)(1),
(2) Date: Jun. 7, 2023

(87) PCT Pub. No.: WO2022/123864
PCT Pub. Date: Jun. 16, 2022

(65) Prior Publication Data
US 2024/0057305 A1 Feb. 15, 2024

(30) Foreign Application Priority Data
Dec. 9, 2020 (JP) ................................. 2020-204491

(51) Int. Cl.
*H05K 9/00* (2006.01)
(52) U.S. Cl.
CPC .................................. *H05K 9/0084* (2013.01)
(58) Field of Classification Search
CPC .................................................... H05K 9/0084
See application file for complete search history.

(56) References Cited

U.S. PATENT DOCUMENTS

2005/0208798 A1 9/2005 Shimoda
2008/0012493 A1 1/2008 Lee et al.
(Continued)

FOREIGN PATENT DOCUMENTS

JP 7290449 A 11/1995
JP 2003285002 A 10/2003
(Continued)

OTHER PUBLICATIONS

International Search Report for PCT/JP2021/035726 dated Dec. 28, 2021, 4 pages.
(Continued)

*Primary Examiner* — Hung V Ngo
(74) *Attorney, Agent, or Firm* — Faegre Drinker Biddle & Reath LLP

(57) ABSTRACT

An electromagnetic wave shielding material includes a metal layer for ground connection provided as an outermost layer of a laminate; wherein only one surface of the metal layer for ground connection is laminated on the insulating layer via the adhesive layer, and assuming $d_1$ is a thickness and $\varepsilon_1$ is a Young's modulus of the adhesive layer on the one surface, $d_2$ is a thickness and $\varepsilon_2$ is a Young's modulus of the metal layer for ground connection, and $\varepsilon_3$ is a composite Young's modulus of the adhesive layer on the one surface and the metal layer for ground connection, the following relational expression is satisfied: $\varepsilon_3/\varepsilon_2 > 0.60$; in which, $\varepsilon_3 = \varepsilon_1 (d_1/(d_1+d_2)) + \varepsilon_2 (d_2 (d_1+d_2))$.

9 Claims, 1 Drawing Sheet

Example 3-1    Example 3-2    Example 3-3

Example 4-1    Example 4-2    Example 4-3

(56) References Cited

U.S. PATENT DOCUMENTS

| | | |
|---|---|---|
| 2016/0014915 A1 | 1/2016 | Posner et al. |
| 2018/0079176 A1* | 3/2018 | Tanaka ................. H05K 9/0088 |
| 2018/0079177 A1 | 3/2018 | Tanaka et al. |
| 2018/0177083 A1* | 6/2018 | Kammuri ................ B32B 27/36 |
| 2018/0263145 A1* | 9/2018 | Tanaka ..................... B32B 7/12 |
| 2018/0281350 A1 | 10/2018 | Tanaka |
| 2020/0315073 A1* | 10/2020 | Tanaka ..................... H05K 9/00 |

FOREIGN PATENT DOCUMENTS

| | | |
|---|---|---|
| JP | 2008021979 A | 1/2008 |
| JP | 4602680 B2 | 12/2010 |
| JP | 2010278119 A | 12/2010 |
| JP | 2012053234 A | 3/2012 |
| JP | 6220132 B2 | 10/2017 |
| JP | 6278922 B2 | 2/2018 |
| JP | 2018171741 A | 11/2018 |

OTHER PUBLICATIONS

International Written Opinion for PCT/JP2021/035726 dated Dec. 28, 2021, 3 pages.
International Preliminary Report on Patentability for PCT/JP2021/035726 dated Jun. 13, 2023, 4 pages.
Extended European Search Report for corresponding EP21902968.3; dated May 10, 2024; 11 pages.

* cited by examiner

Example 3-1　　　Example 3-2　　　Example 3-3

Example 4-1　　　Example 4-2　　　Example 4-3

FIG. 1

Comparative Example 3-1　　　Comparative Example 4-1

FIG. 2

ELECTROMAGNETIC SHIELDING MATERIAL

CROSS REFERENCE TO RELATED APPLICATIONS

The present invention claims the benefit of and priority to Japanese Patent Application No. 2020-204491 filed on Dec. 9, 2020 with the Japanese Patent Office, the entire contents of which are incorporated herein by reference in its entirety.

FIELD OF THE INVENTION

The present invention relates to an electromagnetic wave shielding material. More particularly, the present invention relates to electric/electronic device and their coatings or exteriors.

BACKGROUND OF THE INVENTION

In recent years, interest in global environmental problems has been growing all over the world, and environment-friendly automobiles equipped with secondary batteries, such as electric automobiles and hybrid vehicles, are becoming more popular. Many of these vehicles adopt a method of obtaining driving force by converting a direct current (DC) generated by an on-board secondary battery into an alternating current (AC) via an inverter and then supplying the required power to an AC motor. Electromagnetic waves are generated due to the switching operation of the inverter or the like. Since electromagnetic waves interfere with the reception of in-vehicle audio equipment, wireless equipment, and the like, countermeasures have been taken to house an inverter, or an inverter together with a battery, a motor, or the like in a metal case to shield against electromagnetic waves (Patent Literature 1: Japanese Patent Application Publication No. 2003-285002).

Further, electromagnetic waves are radiated not only from automobiles but also from many electric/electronic devices including communication devices, displays, and medical devices. Electromagnetic waves may cause malfunction of precision equipment, and there is also concern about the influence on the human body. For this reason, various techniques have been developed to reduce the influence of electromagnetic waves using electromagnetic wave shielding materials. For example, a copper foil composite (laminate) obtained by laminating a copper foil and a resin film is used as an electromagnetic wave shielding material (Patent Literature 2: Japanese Patent Application Publication No. H07-290449). The metal foil has electromagnetic wave shielding properties, and the resin film is laminated to reinforce the metal foil. Also known is an electromagnetic wave shield structure in which metal layers are laminated on the inner side and outer side of an intermediate layer made of an insulating material (Patent Literature 3: Japanese Patent No. 4602680). Further, there is also known an optical member for shielding electromagnetic waves, comprising: a base substrate; and a laminated member formed on one surface of the base substrate and composed of a plurality of repeating unit films containing a metal layer and a high refractive index layer (niobium pentoxide) (Patent Literature 4: Japanese Patent Application Publication No. 2008-21979).

Metal foils (metal layers) such as copper foils used for electromagnetic wave shielding materials generally have a thickness of several µm to several tens of µm, so cracks are likely to occur during forming into a laminate with a resin film. Therefore, it is important to suppress cracks and improve formability.

Conventionally, metal laminate materials with formability are known for food applications and battery packages, and resin films are adhered to both sides of a metal foil due to sanitary effects on food, or in order to ensure heat sealability. However, in such a laminate material, both sides of the metal foil are covered with resin films, so it is difficult to ground the metal foil. When such a laminate material is applied as an electromagnetic wave shielding material, resonance or the like occurs due to current components from electromagnetic waves, and the shielding effect is lowered. That is, there is a problem that the shielding effect is limited due to poor ground connectivity.

In addition, as a method for greatly improving the shielding property, there is a technique such as that in Japanese Patent No. 6278922 (Patent Literature 5), but since it is a multilayer structure that requires at least three metal foils, the ground connectivity is further reduced. Since the shield material laminated in multiple layers is bonded through a resin film with low conductivity, in order to ground it, in Japanese Patent Application Publication No. 2010-278119 (Patent Literature 6) discloses a technique for intermittently leaving a conductor layer portion from which the ground of the laminate can be taken out. Further, Japanese Patent Application Publication No. 2012-53234 (Patent Literature 7) discloses a technique of providing a through hole in a laminate for grounding.

PRIOR ART

Patent Literature

[Patent Literature 1] Japanese Patent Application Publication No. 2003-285002
[Patent Literature 2] Japanese Patent Application Publication No. H07-290449
[Patent Literature 3] Japanese Patent No. 4602680
[Patent Literature 4] Japanese Patent Application Publication No. 2008-21979
[Patent Literature 5] Japanese Patent No. 6278922
[Patent Literature 6] Japanese Patent Application Publication No. 2010-278119
[Patent Literature 7] Japanese Patent Application Publication No. 2012-53234

SUMMARY OF THE INVENTION

As in Japanese Patent Application Publication No. 2010-278119 and Japanese Patent Application Publication No. 2012-53234, it is necessary to provide through-holes or peeling portions, which complicates the manufacturing process. Moreover, the configuration disclosed in Japanese Patent Application Publication No. 2010-278119 has a low degree of freedom in design, and cannot cope with forming of a wide variety of products.

The present invention has been made in view of the above circumstances, and in one embodiment, one object of the present invention is to provide an electromagnetic wave shielding material, which is a laminate of a metal layer(s) and insulating layers, wherein the electromagnetic wave shielding material improves the electromagnetic wave shielding effect and suppresses the occurrence of cracks in the metal layer due to forming.

As a result of intensive studies by the inventors, it has been found that, by providing a metal layer for ground connection on the outside of the laminate and exposing the metal layer for ground connection (that is, not covering the metal layer for ground connection with an insulating layer), resonance can be reduced and a sufficient shielding effect can be ensured. By exposing the metal layer, grounding can be performed more easily than by providing a through hole or peeling portions. However, in that case, there is also a problem that cracks are likely to occur in the exposed metal layer, and formability is greatly reduced.

Then, as a result of further intensive studies by the present inventor, it has been found that, by controlling a composite Young's modulus, which takes in account both the Young's modulus of an adhesive layer between the metal layer for ground connection and the adjacent insulating layer and the Young's modulus of the metal layer for ground connection, so as to satisfy a certain condition with respect to the Young's modulus of the metal layer for ground connection, cracks can be effectively suppressed even when forming is performed with the metal layer for ground connection exposed. The present invention has been completed based on the above findings, and is exemplified as below.

An electromagnetic wave shielding material, composed of a laminate in which N metal layer(s) for shield (where N is an integer equal to or greater than 1) and N+1 insulating layers are alternately laminated via adhesive layers, the electromagnetic wave shielding material further comprising a metal layer for ground connection provided as an outermost layer of the laminate;

wherein only one surface of the metal layer for ground connection is laminated on the insulating layer via the adhesive layer, and assuming $d_1$ is a thickness and $\varepsilon_1$ is a Young's modulus of the adhesive layer on the one surface, $d_2$ is a thickness and $\varepsilon_2$ is a Young's modulus of the metal layer for ground connection, and $\varepsilon_3$ is a composite Young's modulus of the adhesive layer on the one surface and the metal layer for ground connection, the following relational expression is satisfied:

$$\varepsilon_3/\varepsilon_2 > 0.60$$

in which, $\varepsilon_3 = \varepsilon_1 (d_1/(d_1+d_2)) + \varepsilon_2 (d_2/(d_1+d_2))$.

The electromagnetic wave shielding material according to [1], wherein the following relational expression is satisfied: $\varepsilon_3/\varepsilon_2 \geq 0.70$.

The electromagnetic wave shielding material according to [1], wherein the following relational expression is satisfied: $\varepsilon_3/\varepsilon_2 \geq 0.80$.

The electromagnetic wave shielding material according to any one of [1] to [3], wherein the composite Young's modulus $\varepsilon_3$ is 25000 to 45000 MPa.

The electromagnetic wave shielding material according to any one of [1] to [4], wherein each metal layer has a thickness of 4 to 100 μm.

The electromagnetic wave shielding material according to any one of [1] to [5], wherein each insulating layer has a thickness of 4 to 600 μm.

The electromagnetic wave shielding material according to any one of [1] to [6], wherein a total thickness of the metal layer for shield and the metal layer for ground connection is 15 to 150 μm.

A coating material or exterior material for electric/electronic device, comprising the electromagnetic wave shielding material according to any one of [1] to [7].

An electric/electronic device comprising the coating material or exterior material according to [8].

According to one embodiment of the present invention, it is possible to provide an electromagnetic wave shielding material which improves the electromagnetic wave shielding effect and suppresses the occurrence of cracks in the metal layer due to forming.

DETAILED DESCRIPTION OF THE INVENTION

Hereinafter, embodiments of the present invention will now be described in detail. It should be understood that the present invention is not intended to be limited to the following embodiments, and any change, improvement or the like of the design may be appropriately added based on ordinary knowledge of those skilled in the art without departing from the spirit of the present invention.

(1. Metal Layer for Shield)

According to one embodiment of the present invention, there are no particular restrictions on the material of the metal layer for shield that constitute the electromagnetic wave shielding material. However, from the viewpoint of enhancing shielding properties against AC magnetic fields and AC electric fields, it is preferable to use a metal material with excellent conductivity. Specifically, it is preferably made of a metal having a conductivity of $1.0 \times 10^6$ S/m (value at 20° C.; the same shall apply hereinafter) or more, More preferably, the electrical conductivity of the metal is $10.0 \times 10^6$ S/m or more, even more preferably $30.0 \times 10^6$ S/m or more, and most preferably $50.0 \times 10^6$ S/m or more. Such metals include iron, which has a conductivity of about $9.9 \times 10^6$ S/m; nickel, which has a conductivity of about $14.5 \times 10^6$ S/m; aluminum, which has a conductivity of about $33.0 \times 10^6$ S/m; copper, which has a conductivity of about $58.0 \times 10^6$ S/m; and silver, which has a conductivity of about $61.4 \times 10^6$ S/m. Considering both conductivity and cost, it is practically preferable to employ aluminum or copper. The metal layer for shield constituting the electromagnetic wave shielding material according to one embodiment of the present invention may all be made of the same metal, or different metals may be used for each layer. Alloys containing the metals mentioned above can also be used.

Various surface treatment layers may be formed on the shielding metal surface for the purpose of adhesion promotion, environmental resistance, heat resistance, rust prevention, and the like. For example, for the purpose of increasing the environmental resistance and heat resistance required when the metal surface is the outermost layer, Au plating, Ag plating, Sn plating, Ni plating, Zn plating, Sn alloy plating (Sn—Ag, Sn—Ni, Sn—Cu, and the like), chromate treatment, and the like can be applied. These treatments may be combined. From the viewpoint of cost, Sn plating or Sn alloy plating is preferable. Further, chromate treatment, roughening treatment, Ni plating, or the like can be performed for the purpose of improving the adhesion between the metal layer for shield and the insulating layer. These treatments may be combined. Roughening treatment is preferable because it is easy to obtain adhesion. In addition, metal plating having a high relative magnetic permeability can be provided for the purpose of enhancing the shielding effect against a DC magnetic field. Examples of metal plating having a high relative magnetic permeability include Fe—Ni alloy plating and Ni plating.

When a copper foil is used, it preferably has a high degree of purity, preferably 99.5% by mass or more, more preferably 99.8% by mass or more, because it improves the shielding performance. As the copper foil, rolled copper foil, electrolytic copper foil, metallized copper foil, and the like can be used. A rolled copper foil is preferred because it is excellent in bendability and formability (formability includes drawability; the same shall apply hereinafter). When alloying elements are added to the copper foil to form the copper alloy foil, the total content of these elements including unavoidable impurities is preferably less than 0.5% by mass. In particular, among copper foils, those containing at least one selected from the group of Sn, Mn, Cr, Zn, Zr, Mg, Ni, Si, and Ag of 200 to 2000 ppm by mass in total, and/or P from 10 to 50 ppm by mass are preferable because elongation is improved as compared with a pure copper foil having the same thickness.

According to one embodiment of the present invention, it is preferable that the thickness of each metal layer for shield constituting the electromagnetic wave shielding material is 4 μm or more. If the thickness is 4 μm or more, it is possible to avoid difficulty in handling, and it is possible to prevent the ductility of the metal layer for shield from significantly lowering and the formability of the laminate from becoming insufficient. In addition, if the thickness of each foil is less than 4 μm, it becomes necessary to laminate a large number of metal layers for shield in order to obtain an excellent electromagnetic wave shielding effect, which raises the problem of increased manufacturing costs. From such a viewpoint, the thickness of each metal layer for shield is preferably 10 μm or more, even more preferably 15 μm or more, even more preferably 20 μm or more, even more preferably 25 μm or more, and even more preferably 30 μm or more. On the other hand, if the thickness of the foil exceeds 100 μm per sheet, the formability may be deteriorated, so the thickness of the foil is preferably 100 μm or less, more preferably 50 μm or less, even more preferably 45 μm or less, and even more preferably 40 μm or less.

The metal layer for shield constituting the electromagnetic wave shielding material may be a single sheet, but from the viewpoint of improving formability and shielding performance, a plurality of metal layers for shield constituting the electromagnetic wave shielding material may be preferably laminated via insulating layers. From the viewpoint of ensuring excellent electromagnetic wave shielding characteristics while reducing the total thickness of the electromagnetic wave shielding material, it is more preferable to laminate two or more metal layers for shield with insulating layers interposed therebetween. By laminating two or more metal layers for shield via insulating layers, even if the total thickness of the metal layers for shield is the same, the shielding effect is remarkably improved as compared with the case where the metal layer for shield is a single layer or the case where two metal layers for shield are laminated without an insulating layer. If the metal layers for shield are directly laminated on each other, the total thickness of the shielding metal layers increases, thereby improving the shielding effect. However, no remarkable improvement effect can be obtained. In other words, when a plurality of metal layers for shield constituting the laminate is laminated via insulating layers, the total thickness of the metal layers for shield required to obtain the same electromagnetic wave shielding effect can be reduced, so it is possible to achieve both the weight reduction of the laminate and the electromagnetic wave shielding effect.

This is presumably because the presence of the resin layer between the metal layers for shield increases the number of reflections of the electromagnetic wave and attenuates the electromagnetic wave. However, although the electromagnetic wave shielding characteristics can be improved by increasing the number of laminations of the metal layer for shield, the increasing number of laminations also increases the number of lamination processes, leading to an increase in manufacturing costs. Also, the shield improvement effect tends to saturate. Therefore, the number of the metal layers for shield constituting the laminate is preferably 5 or less, more preferably 4 or less, and more preferably 3 or less.

In one embodiment of the present invention, when a plurality of metal layers for shield is formed, all the metal layers for shield may be made of the same material, or different materials may be used for each layer. In addition, all the metal layers for shield may have the same thickness, or may have different thicknesses for each layer.

Therefore, in the electromagnetic wave shielding material according to one embodiment of the present invention, the total thickness of all metal layers may be 15 to 150 μm, may be 100 μm or less, may be 80 μm or less, and may be 60 μm or less. As will be described later, the metal layer for ground connection has one surface that is not covered with an insulating layer and can be easily grounded, so it is referred to as a metal layer for ground connection, but it will be acknowledged that, it is common to the metal layer for shield in that it has an electromagnetic wave shielding effect. Therefore, the total thickness here refers to the total thickness of all the metal layers for shield and the metal layer for ground connection.

In order to obtain a certain strength of the electromagnetic wave shielding material, strength is required for the metal layer for shield. However, if the strength is too high, the ductility of the metal layer for shield is lowered, and cracks are likely to occur. Accordingly, the Young's modulus of the metal layer for shield is preferably 50 MPa to 200 MPa, more preferably 50 MPa to 150 MPa, even more preferably 50 MPa to 100 MPa. A method will be described later for measuring the Young's modulus of the metal layer for shield and the metal layer for ground connection, which will be described later.

(2. Metal Layer for Ground Connection)

In one embodiment of the invention, a metal layer for ground connection is provided as the outermost layer of a laminate of metal layer(s) for shield and insulating layer(s), and only one surface of the metal layer for ground connection is laminated on the insulating layer via an adhesive layer. That is, the other surface of the metal layer for ground connection is exposed and forms part of the outer surface of the electromagnetic wave shielding material.

The metal layer for ground connection is easy to be connected to ground, so it is referred to a metal layer for ground connection. However, since it is common to the metal layer for shield in terms of having an electromagnetic wave shielding effect, the characteristics such as composition, surface treatment, thickness, and the like described for the metal layer for shield are also applicable to the metal layer for ground connection. In one embodiment, in the electromagnetic wave shielding material, the metal layer for ground connection may have the same composition and thickness as the metal layer for shield. Therefore, in the present specification, when the term "each metal layer" is used, or simply the term "metal layer" is used, both the metal layer for shield and the metal layer for ground connection can be of interest.

Since one surface of the metal layer for ground connection is exposed as part of the outer surface of the electromagnetic wave shielding material, by forming a current path for grounding connection from this surface, grounding can be easily performed, resonance can be reduced, and the electromagnetic wave shielding effect of the electromagnetic wave shielding material is significantly improved. Furthermore, if an outer shell of an electric/electronic equipment to which the electromagnetic wave shielding material is applied is metal, even without forming a separate current path, ground connection may be realized by providing the electromagnetic wave shielding material so that the metal layer for ground connection is in contact with the outer shell of the electric/electronic device.

Therefore, with the above configuration of the present embodiment, grounding can be easily performed without providing a through hole or peeling portion unlike the conventional technology, and an improvement in the electromagnetic wave shielding effect can be expected. However, even if a means such as providing a through hole or a peeling portion is additionally adopted, as long as ground connection can be realized, the effect of this embodiment is not hindered, so the present embodiment does not exclude addition of other ground connection means.

In addition, in the present embodiment, as to the metal layer for shield and the metal layer for ground connection, as described above, the metal layer for ground connection differs from other metal layers in that one surface of the metal layer is not covered with an insulating layer, making it easy to connect to the ground, and is distinguished for convenience. Since the metal layer for ground connection is also a metal layer, it has an electromagnetic wave shielding effect, and conversely, it is also possible to provide a ground connection means for the metal layer for shield. However, the metal layer for shield is not easy to ground because both sides are covered with insulating layers. The means for grounding the metal layer for shield is not limited, but it is conceivable to provide a through hole or peeling portion as in the prior art.

(3. Insulating Layer)

In the electromagnetic wave shielding material according to one embodiment of the present invention, a significant improvement in the electromagnetic wave shielding effect by laminating a plurality of metal layers for shield can be achieved by inserting an insulating layer between the metal layers for shield. If the metal layers for shield are directly laminated on each other, the total thickness of the shielding metal layers increases, thereby improving the shielding effect, but a significant improvement effect cannot be obtained. This is presumably because the presence of the insulating layer between the metal layers for shield increases the number of reflections of the electromagnetic wave and attenuates the electromagnetic wave.

As the insulating layer, a material having a large difference in impedance from the metal layer is preferable for obtaining an excellent electromagnetic wave shielding effect. In order to generate a large impedance difference, the dielectric constant of the insulating layer should be small, and specifically, it is preferably 10 (value at 20° C.; the same shall apply hereinafter) or less, more preferably 5.0 or less, and even more preferably 3.5 or less. In principle, the dielectric constant never becomes smaller than 1.0. Normally available materials have a minimum value of 2.0, and even if it is lowered closer to 1.0, the increase in shielding effect is limited, whereas the material itself becomes special and expensive. Considering the balance between cost and performance, the dielectric constant is preferably 2.0 or more, and more preferably 2.2 or more.

Specifically, materials constituting the insulating layer include glass, metal oxides, paper, natural resins, and synthetic resins. From the viewpoint of workability, resins, particularly synthetic resins, are preferred. Therefore, in one embodiment of the invention, the insulating layer is a resin layer. These materials can also be mixed with fiber reinforcements such as carbon fibers, glass fibers, and aramid fibers. As a synthetic resin, from the viewpoint of availability and workability, mention can be made to polyesters such as PET (polyethylene terephthalate), PEN (polyethylene naphthalate) and PBT (polybutylene terephthalate); olefin resins such as polyethylene and polypropylene; polyamide, polyimide, liquid crystal polymer, polyacetal, fluorine resin, polyurethane, acrylic resin, epoxy resin, silicone resin, phenol resin, melamine resin, ABS resin, polyvinyl alcohol, urea resin, polyvinyl chloride, polycarbonate, polystyrene, styrene-butadiene rubber, and the like. Among these, PET, PEN, polyamide, and polyimide are preferred for reasons of workability and cost. The synthetic resin can also be an elastomer such as urethane rubber, chloroprene rubber, silicone rubber, fluororubber, styrene, olefin, vinyl chloride, urethane, and amide. The insulating layers used in the electromagnetic wave shielding material according to one embodiment of the present invention may all be made of the same resin material, or different resin materials may be used for each layer.

The resin material can be laminated in a film-like or fibrous form. In addition, the resin layer may be formed by applying an uncured resin composition to the metal layer for shield and then curing the resin composition, but it is preferable to use a resin film that can be attached to the metal layer for the ease of production. In particular, a PET film can be preferably used. In particular, the strength of the shielding material can be increased by using a biaxially stretched film as the PET film.

The thickness of the insulating layer is not particularly limited, but if the thickness per layer is less than 4 μm, the (elongation) breaking strain of the shield material tends to decrease. Therefore, the thickness of each insulating layer is preferably 4 μm or more, more preferably 7 μm or more, more preferably 9 μm or more, even more preferably 10 μm or more, even more preferably 20 μm or more, even more preferably 40 μm or more, even more preferably 80 μm or more, and even more preferably 100 μm or more. On the other hand, even if the thickness per sheet exceeds 600 μm, the (elongation) breaking strain of the shield material tends to decrease. Therefore, the thickness of each insulating layer is preferably 600 μm or less, more preferably 500 μm or less, more preferably 400 μm or less, more preferably 250 μm or less, and even more preferably 200 μm or less. In one embodiment of the present invention, all insulating layers may have the same thickness, or each layer may have a different thickness.

In one embodiment of the invention, the insulating layer is a resin layer. In general, resin layers are more ductile than metal layers. Therefore, by supporting both sides of each metal layer for shield with a resin layer, the ductility of the metal layer for shield is significantly improved, and the formability of the laminate is significantly improved. If the metal layers for shield are directly laminated on each other, the effect of improving the formability cannot be obtained.

Various surface treatments may be performed on the surface of the resin layer for the purpose of promoting adhesion with the metal layer. For example, the adhesion between the resin layer and the metal layer for shield can be enhanced by applying a primer coat or corona treatment to the bonding surface of the resin layer and the metal layer for shield.

(4. Adhesive Layer)

In one embodiment of the present invention, the metal layer(s) for shield are laminated with an insulating layer(s) interposed therebetween via an adhesive layer(s). The adhesive is not particularly limited, but acrylic resin, epoxy resin, urethane, polyester, silicone resin, vinyl acetate, styrene butadiene rubber, nitrile rubber, phenol resin, cyanoacrylate, and the like can be mentioned. For reasons of ease of manufacture and cost, urethane, polyester, and vinyl acetate materials are preferred. In one embodiment of the present invention, when a plurality of adhesive layers is formed, all adhesive layers may be made of the same material, or different materials may be used for each layer.

Further, in one embodiment of the present invention, the metal layer(s) for ground connection is laminated an insulating layer(s) interposed therebetween via an adhesive layer(s). The adhesive between the metal layer for ground connection and the insulating layer may be different or the same as the adhesive between the metal layer for shield and the insulating layer, and it is preferable from the viewpoint of productivity that they are the same.

Adhesives generally have lower strength than a resin layer or a metal layer. Therefore, if the adhesive layer is too thick, it tends to impede the improvement of the ductility of the metal layer by laminating the resin layer. On the other hand, if the adhesive layer is too thin, it is difficult to apply the adhesive to the entire interface between the metal layer and the resin layer, resulting in unbonded portions. Therefore, the thickness $d_1$ of the adhesive layer is preferably 1 μm or more and 20 μm or less, more preferably 1.5 μm or more and 15 μm or less, and even more preferably 2 μm or more and 10 μm or less. A method for measuring the thickness $d_1$ of the adhesive layer will be described later.

In order not to hinder the ductility improvement of the metal layer by laminating the insulating layer, the strength of the adhesive layer can be increased. However, if the strength is increased too much, the ductility of the adhesive layer tends to decrease, which conversely hinders improvement in ductility. On the other hand, if the adhesive layer becomes too soft, it will hinder the improvement of ductility even in the above-mentioned thickness range. The Young's modulus $\varepsilon_1$ of the adhesive layer is preferably 1 MPa to 1500 MPa, more preferably 3 MPa to 1000 MPa, even more preferably 5 MPa to 800 MPa. A method for measuring the Young's modulus $\varepsilon_1$ of the adhesive layer will be described later. The Young's modulus of the adhesive layer can be adjusted, for example, by adjusting the amount of curing agent in the adhesive composition.

(5. Electromagnetic Wave Shielding Material)

In one embodiment of the invention, there is provided an electromagnetic wave shielding material which is a laminate in which N metal layer(s) for shield (where N is an integer equal to or greater than 1) and N+1 insulating layers are alternately laminated via adhesive layers, the electromagnetic wave shielding material further comprising a metal layer for ground connection provided as an outermost layer of the laminate;

wherein only one surface of the metal layer for ground connection is laminated on the insulating layer via the adhesive layer, and assuming $d_1$ is a thickness and $\varepsilon_1$ is a Young's modulus of the adhesive layer on the one surface, $d_2$ is a thickness and $\varepsilon_2$ is a Young's modulus of the metal layer for ground connection, and $\varepsilon_3$ is a composite Young's modulus of the adhesive layer on the one surface and the metal layer for ground connection, the following relational expression is satisfied:

$$\varepsilon_3/\varepsilon_2 > 0.60$$

in which, $\varepsilon_3 = \varepsilon_1 (d_1/(d_1+d_2)) + \varepsilon_2 (d_2/(d_1+d_2))$.

N is not particularly limited as long as it is an integer of 1 or more, and by increasing N, a higher electromagnetic wave shielding effect can be obtained. However, as noted above, typically N is 1, 2, 3, 4, or 5.

In one embodiment of the invention, assuming $d_1$ is the thickness, and $\varepsilon_1$ is the Young's modulus of the adhesive layer on the surface of the metal layer for ground connection which is laminated with the insulating layer via the adhesive layer, $d_2$ is the thickness and $\varepsilon_2$ is the Young's modulus of the metal layer for ground connection, and $\varepsilon_3$ is the composite Young's modulus of the adhesive layer and the metal layer for ground connection, the relational expression $\varepsilon_3/\varepsilon_2 > 0.60$ is satisfied in which the calculation uses the formula $\varepsilon_3 = \varepsilon_1 (d_1/(d_1+d_2)) + \varepsilon_2 (d_2/(d_1+d_2))$.

When the composite Young's modulus $\varepsilon_3$ of the adhesive layer and the metal layer for ground connection, and the Young's modulus $\varepsilon_2$ of the metal layer for ground connection satisfy the above relational expression, it is possible to effectively suppress the occurrence of cracks in the metal layer for ground connection when performing forming such as punching or drawing on the laminate. Although it is not intended to limit the present invention by theory, it is presumed that by satisfying the above relational expression, it becomes difficult to cause a difference in deformation amount between the metal layer for ground connection and the adhesive layer, so that local constriction that occurs in the metal layer for ground connection and/or the metal layer are suppressed, and as a result, cracks are less likely to occur.

From this point of view, in a preferred embodiment of the present invention, the composite Young's modulus $\varepsilon_3$ of the adhesive layer and the metal layer for ground connection satisfies the relational expression $\varepsilon_3/\varepsilon_2 \geq 0.70$. In a more preferred embodiment of the present invention, the composite Young's modulus $\varepsilon_3$ of the adhesive layer and the metal layer for ground connection satisfies the relational expression $\varepsilon_3/\varepsilon_2 \geq 0.80$. In an even more preferred embodiment of the present invention, the composite Young's modulus $\varepsilon_3$ of the adhesive layer and the metal layer for ground connection satisfies the relational expression $\varepsilon_3/\varepsilon_2 \geq 0.85$. In an even more preferred embodiment of the present invention, the composite Young's modulus $\varepsilon_3$ of the adhesive layer and the metal layer for ground connection satisfies the relational expression $\varepsilon_3/\varepsilon_2 \geq 0.90$. The upper limit of the ratio $\varepsilon_3/\varepsilon_2$ of the composite Young's modulus $\varepsilon_3$ of the adhesive layer and the metal layer for ground connection to $\varepsilon_2$ is not particularly limited, but in terms of technical difficulties and practical needs, typically, it may be 0.95 or less, may be 0.90 or less, may be 0.86 or less, and may be 0.80 or less.

Further, in order to easily set the ratio $\varepsilon_3/\varepsilon_2$ of the composite Young's modulus $\varepsilon_3$ of the adhesive layer and the metal layer for ground connection to $\varepsilon_2$ within the above range, the composite Young's modulus $\varepsilon_3$ is, for example, preferably within the range of 25,000 to 45,000 MPa, more preferably within the range of 26,500 to 45,000 MPa, and even more preferably within the range of 29,000 to 45,000 MPa.

The electromagnetic wave shielding material according to various embodiments of the present invention is particularly applicable to usages in various electromagnetic wave shielding applications, such as covering material or exterior material for electric/electronic device (for example, inverters, communication devices, resonators, electron tubes/discharge lamps, electric heating devices, electric motors, generators, electronic components, printed circuits, medical devices, and the like), covering material for harnesses and communication cables connected to electric/electronic device, electromagnetic wave shielding sheets, electromagnetic wave shielding panels, electromagnetic wave shielding bags, electromagnetic wave shielding boxes, electromagnetic wave shielding chambers.

Examples

Examples of the present invention are shown below together with Comparative Examples. However, they are provided for a better understanding of the invention and its advantages, and are not intended to be limiting of the invention.

By preparing each metal layer and insulating layer described in Table 1, electromagnetic wave shielding materials of Examples and Comparative Examples were prepared. The symbols described in Table 1 indicate the following.

Cu: rolled copper foil (conductivity at 20° C.: $58.0 \times 10^6$ S/m)

Al: aluminum foil (conductivity at 20° C.: $33.0 \times 10^6$ S/m)

PET: polyethylene terephthalate film (dielectric constant at 20° C.: 3.0)

M: metal layer (referring to various metal layers in each Example)

A urethane adhesive was prepared as the adhesive, and a curing agent was appropriately added to prepare an adhesive having a Young's modulus $\varepsilon_1$ shown in Table 1.

Using the above metal foils and resin films, various laminates having the laminate structure shown in Table 1 were prepared. In Table 1, the order of the members described in the column of "Configuration" matches the order of the actual laminate. The areas of the bonding surfaces of the metal layers and the insulating layers were set to be the same, and the layers were laminated so as not to protrude from each other. A predetermined amount of adhesive was applied to the bonding surface of the insulating layer using a control coater (manufactured by Imoto machinery Co., LTD.). The coating speed was 50 mm/min. Next, after pressing at 80° C. for 30 minutes with a vacuum heating press, the metal layer and the insulating layer were adhered and laminated by holding for 7 days in a constant temperature bath kept at 40° C. in order to accelerate the curing reaction.

(Measurement of Thickness $d_1$ of Adhesive Layer)

Using a control coater (manufactured by Imoto machinery Co., LTD.) on a desktop coater, the urethane adhesive after addition of curing agent was applied onto the Cu foil, and reacted in a constant temperature bath which was heated to 40° C. for 7 days. After that, the Cu foil was divided into four parts in the width direction, and the length was measured using a micrometer every 10 mm in the longitudinal direction. The thickness of the Cu foil was subtracted from the average value of five measurements, all average values in the longitudinal direction and the width direction were calculated, and the average value was used as the measured value of the thickness of the adhesive layer. Then, the measured value was taken as the thickness $d_1$ of the adhesive layer in the laminate formed in which the adhesive layer was formed under the same conditions.

(Measurement of Young's Modulus $\varepsilon_1$ of Adhesive Layer)

The urethane adhesive in each example after addition of the curing agent was applied to a Teflon (registered trademark) sheet to a thickness of 50 μm, and placed in a drying oven at 40° C. to cure for 7 days. After that, a tensile test was performed based on JIS K7127. The shape of the test piece was 12.7 mm wide and the distance between chucks was 100 mm. The tensile speed was set to 50 mm/min. The Young's modulus obtained by the tensile test was used as the measured value of the Young's modulus of the adhesive layer. Then, the measured value was taken as the Young's modulus $\varepsilon_1$ of the adhesive layer in the laminate in which the adhesive layer was formed using the adhesive of the same composition.

(Measurement of Thickness $d_2$ of Metal Layer for Ground Connection)

The thickness $d_2$ of the metal layer for ground connection was obtained by dividing the metal layer into four parts in the width direction and measuring for five times using a micrometer at intervals of 10 mm in the longitudinal direction. All average values in the longitudinal direction and the width direction were calculated from the average value of the five measurements, and the average value was used as the measured value of the thickness $d_2$ of the metal layer for ground connection.

(Measurement of Young's Modulus $\varepsilon_2$ of Metal Layer for Ground Connection)

A test piece with a width of 12.7 mm was cut from each example of the metal layer for ground connection (a metal layer laminated with an insulating layer on only one surface), and a tensile test was performed in accordance with JIS K7127 with a chuck-to-chuck distance of 100 mm and a tensile speed of 50 mm/min to measure the Young's modulus.

(Evaluation of Formability)

Figure 1:
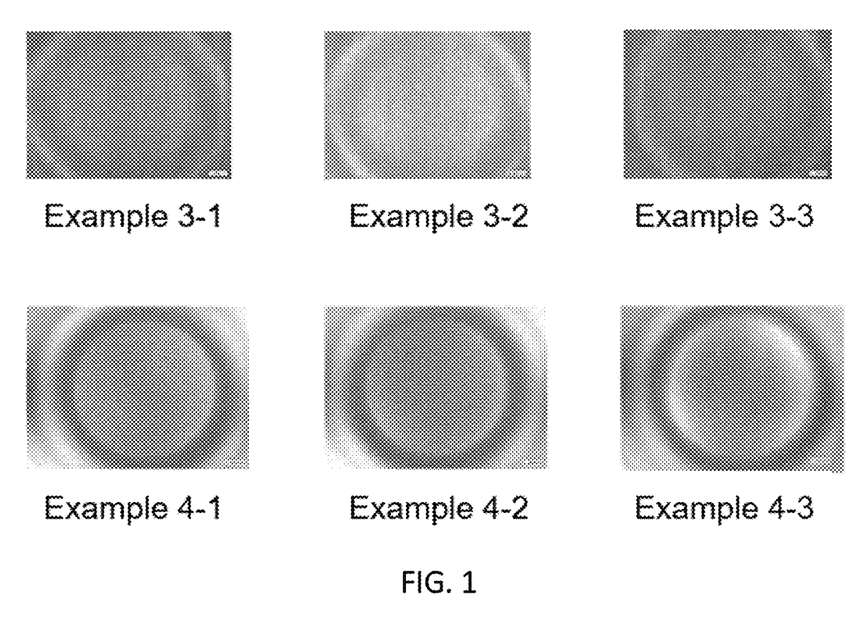
FIG. 1 is a photograph of laminate test pieces of some Examples after processing under predetermined conditions for evaluating the formability of laminates.
Figure 2:
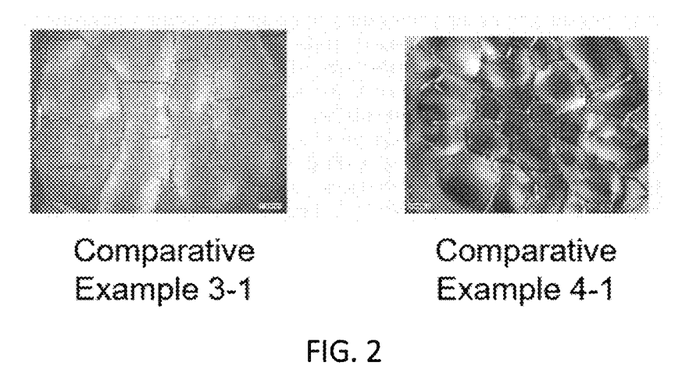
FIG. 2 is a photograph of laminate test pieces of some Comparative Examples after processing under predetermined conditions for evaluating the formability of laminates.

Forming limit was evaluated using a mold for FLD (forming limit diagram). The mold was designed by reducing the size described in ISO-12004-2-2008 to 25%. The dimensions of the punch were d=22.5 mm and punch shoulder R=6 mm. The pressing pressure of the mold was 4000 N as the initial pressure, which was sufficient to press the metal-resin composite test piece. A circular test piece with a diameter of 60 mm was cut out from the laminate of each example, and each test piece was forming processed with a punch extrusion depth of 1 mm to 8 mm. Each test piece was visually checked, and if a crack penetrating the metal layer for ground connection was observed in the foil type, it was evaluated as "x" (cross) for having a crack (see FIG. 2), and of no crack penetrating the metal layer for ground connection was observed, it was evaluated as normal and evaluated as "O " (circle) (see FIG. 1).

(Evaluation of Electromagnetic Wave Shield Effect)

The laminate of each example was placed in an electromagnetic wave shielding effect evaluation device (Techno Science Japan Co., Ltd, model TSES-KEC), and the electromagnetic wave shielding effect was evaluated by the KEC method at a frequency of 1 MHz and at 20° C. Evaluation criteria are as follows.

"O" (circle) Shows a value higher than the ideal magnetic field shielding effect for the total thickness of the foils used in the laminate.

"x" (cross) Shows a value lower than the ideal magnetic field shielding effect for the total thickness of the foils used in the laminate.

In addition, the ideal magnetic field shielding effect SE (dB) was calculated using the Schelkunoff's formula.

First, let the incident wave, reflected wave and transmitted wave (electric field, magnetic field) be the incident wave ($E_{xi}$, $H_{yi}$), the reflected wave ($E_{xr}$, $H_{yr}$), and the transmitted wave ($E_{xt}$, $H_{yt}$), respectively, the electromagnetic field ($E_{x1}$, $H_{y1}$) on the incident side and the electromagnetic field ($E_{x2}$, $H_{y2}$) on the transmitted side are expressed by the following equations.

$$E_{x1} = E_{xi} + E_{xr} \quad (1)$$

$$H_{y1} = H_{yi} + H_{yr} = (E_{xi} + E_{xr})/Z_0 \quad (2)$$

$$E_{x2} = E_{xt} \quad (3)$$

$$H_{y2} = H_{yt} = E_{xt}/Z_0 \quad (4)$$

In the formula, $Z_0$ is the vacuum wave impedance.

Then, the propagation constant y of the electromagnetic wave shielding material 10 and the wave impedance $Z_0$ of the electromagnetic wave shielding material 10 are expressed by the following equations.

$$\gamma = \sqrt{j\omega\mu(\sigma + j\omega\varepsilon)} \quad z_c = \sqrt{j\omega\mu/(\sigma + j\omega\varepsilon)}$$

In the formula, A is Cosh (y·d), B is $Z_c$·sinh (y·d), C is sinh (y·d)/$Z_c$, D is Cosh (y·d), and d is the thickness of the electromagnetic wave shielding material 10.

By substituting equations (1) to (4) into equation (5) and eliminating variables other than $E_{xi}$ and $E_{xr}$, the relationship between the electric field intensity $E_{xi}$ of the incident wave and the electric field intensity $E_{xt}$ of the transmitted wave can be obtained. A certain shielding effect SE (dB) is obtained from the following equation. A shielding effect SE (dB), which is transmission loss, is obtained from the following equation.

$$SE(\text{dB}) = 20\log\left|\frac{A + \frac{B}{Z_0} + Z_0 C + D}{2}\right|$$

TABLE 1

| | Metal layer | Configuration | $d_1$ (μm) | $\varepsilon_1$ (MPa) | $d_2$ (μm) | $\varepsilon_2$ (MPa) | $\varepsilon_3$ (MPa) | $\varepsilon_3/\varepsilon_2$ | Formability | Shield effect |
|---|---|---|---|---|---|---|---|---|---|---|
| Example 1-1 | Cu | PET/M/PET/M/PET/M | 2 | 526 | 18 | 46320 | 41741 | 0.90 | ○ | ○ |
| Example 1-2 | Cu | PET/M/PET/M/PET/M | 4 | 526 | 18 | 46320 | 37994 | 0.82 | ○ | ○ |
| Examples 1-3 | Cu | PET/M/PET/M/PET/M | 8 | 526 | 18 | 46320 | 32230 | 0.70 | ○ | ○ |
| Comparative Example 1-1 | Cu | PET/M/PET/M/PET/M | 24 | 526 | 18 | 46320 | 20152 | 0.44 | X | ○ |
| Comparative Example 1-2 | Cu | PET/M/PET/M/PET/M/PET | 4 | 526 | 18 | 46320 | 37994 | 0.82 | ○ | X |
| Example 2-1 | Al | PET/M/PET/M/PET/M | 2 | 526 | 35 | 32600 | 30866 | 0.95 | ○ | ○ |
| Example 2-2 | Al | PET/M/PET/M/PET/M | 4 | 526 | 35 | 32600 | 29310 | 0.90 | ○ | ○ |
| Example 2-3 | Al | PET/M/PET/M/PET/M | 8 | 526 | 35 | 32600 | 26633 | 0.82 | ○ | ○ |
| Comparative Example 2-1 | Al | PET/M/PET/M/PET/M | 24 | 526 | 35 | 32600 | 19553 | 0.60 | X | ○ |
| Comparative Example 2-2 | Al | PET/M/PET/M/PET/M/PET | 24 | 526 | 35 | 32600 | 19553 | 0.60 | ○ | X |
| Example 3-1 | Cu | PET/M/PET/M/PET/M | 2 | 36 | 18 | 46320 | 41692 | 0.90 | ○ | ○ |
| Example 3-2 | Cu | PET/M/PET/M/PET/M | 4 | 36 | 18 | 46320 | 37905 | 0.82 | ○ | ○ |
| Example 3-3 | Cu | PET/M/PET/M/PET/M | 8 | 36 | 18 | 46320 | 32079 | 0.69 | ○ | ○ |
| Comparative Example 3-1 | Cu | PET/M/PET/M/PET/M | 24 | 36 | 18 | 46320 | 19872 | 0.43 | X | ○ |
| Comparative Example 3-2 | Cu | PET/M/PET/M/PET/M/PET | 4 | 36 | 18 | 46320 | 37905 | 0.82 | ○ | X |
| Example 4-1 | Al | PET/M/PET/M/PET/M | 2 | 36 | 35 | 32600 | 30840 | 0.95 | ○ | ○ |
| Example 4-2 | Al | PET/M/PET/M/PET/M | 4 | 36 | 35 | 32600 | 29260 | 0.90 | ○ | ○ |
| Example 4-3 | Al | PET/M/PET/M/PET/M | 8 | 36 | 35 | 32600 | 26542 | 0.81 | ○ | ○ |
| Comparative Example 4-1 | Al | PET/M/PET/M/PET/M | 24 | 36 | 35 | 32600 | 19354 | 0.59 | X | ○ |
| Comparative Example 4-2 | Al | PET/M/PET/M/PET/M/PET | 4 | 36 | 35 | 32600 | 29260 | 0.90 | ○ | X |
| Example 5-1 | Cu | PET/M/PET/M/PET/M | 2 | 1275 | 18 | 46320 | 41816 | 0.90 | ○ | ○ |
| Example 5-2 | Cu | PET/M/PET/M/PET/M | 4 | 1275 | 18 | 46320 | 38130 | 0.82 | ○ | ○ |
| Example 5-3 | Cu | PET/M/PET/M/PET/M | 8 | 1275 | 18 | 46320 | 32460 | 0.70 | ○ | ○ |
| Comparative Example 5-1 | Cu | PET/M/PET/M/PET/M | 24 | 1275 | 18 | 46320 | 20580 | 0.44 | X | ○ |
| Comparative Example 5-2 | Cu | PET/M/PET/M/PET/M/PET | 4 | 1275 | 18 | 46320 | 38130 | 0.82 | ○ | X |
| Example 6-1 | Al | PET/M/PET/M/PET/M | 2 | 1275 | 35 | 32600 | 30907 | 0.95 | ○ | ○ |
| Example 6-2 | Al | PET/M/PET/M/PET/M | 4 | 1275 | 35 | 32600 | 29387 | 0.90 | ○ | ○ |
| Example 6-3 | Al | PET/M/PET/M/PET/M | 8 | 1275 | 35 | 32600 | 26772 | 0.82 | ○ | ○ |
| Example 7-1 | Cu | PET/M/PET/M/PET/M | 2 | 526 | 12 | 46320 | 39778 | 0.86 | ○ | ○ |
| Example 7-2 | Cu | PET/M/PET/M/PET/M | 4 | 526 | 12 | 46320 | 34872 | 0.75 | ○ | ○ |
| Example 7-3 | Cu | PET/M/PET/M/PET/M | 8 | 526 | 12 | 46320 | 28002 | 0.60 | ○ | ○ |
| Comparative Example 7 | Cu | PET/M/PET/M/PET/M/PET | 24 | 526 | 12 | 46320 | 15791 | 0.34 | X | ○ |

In the formula, j is the imaginary unit, ω is the angular frequency (ω=2 πf, f is the frequency), μ is the magnetic permeability, σ is the electrical conductivity, and ε is the permittivity.

Herein, the incident side electromagnetic field ($E_{x1}$, $H_{y1}$) is expressed as follows using a four-terminal matrix called a transmission F matrix based on the transmitted side electromagnetic field ($E_{x2}$, $H_{y2}$).

$$\begin{pmatrix} E_{x1} \\ H_{y1} \end{pmatrix} = F \begin{pmatrix} E_{x2} \\ H_{y2} \end{pmatrix} \quad F = \begin{pmatrix} A & B \\ C & D \end{pmatrix} \quad (5)$$

DISCUSSION

According to Table 1, when the ratio $\varepsilon_3/\varepsilon_2$ of the composite Young's modulus $\varepsilon_3$ of the adhesive layer and the metal layer for ground connection to $\varepsilon_2$ satisfies the relational expression $\varepsilon_3/\varepsilon_2 > 0.60$, a good electromagnetic wave shielding effect is obtained. In addition, no cracks penetrating the metal layer for ground connection due to the forming process were generated, and the formability was excellent.

The invention claimed is:

1. An electromagnetic wave shielding material, composed of a laminate in which N metal layer(s) for shield (where N is an integer equal to or greater than 1) and N+1 insulating layers are alternately laminated via adhesive layers, the electromagnetic wave shielding material further comprising a metal layer for ground connection provided as an outermost layer of the laminate;

wherein only one surface of the metal layer for ground connection is laminated on the insulating layer via the adhesive layer, and assuming $d_1$ is a thickness and $\varepsilon_1$ is a Young's modulus of the adhesive layer on the one surface, $d_2$ is a thickness and $\varepsilon_2$ is a Young's modulus of the metal layer for ground connection, and $\varepsilon_3$ is a composite Young's modulus of the adhesive layer on the one surface and the metal layer for ground connection, the following relational expression is satisfied:

$$\varepsilon_3/\varepsilon_2 > 0.60$$

in which, $\varepsilon_3 = \varepsilon_1 (d_1/(d_1+d_2)) + \varepsilon_2 (d_2/(d_1+d_2))$.

2. The electromagnetic wave shielding material according to claim 1, wherein the following relational expression is satisfied: $\varepsilon_3/\varepsilon_2 \geq 0.70$.

3. The electromagnetic wave shielding material according to claim 1, wherein the following relational expression is satisfied: $\varepsilon_3/\varepsilon_2 \geq 0.80$.

4. The electromagnetic wave shielding material according to claim 1, wherein the composite Young's modulus $\varepsilon_3$ is 25000 to 45000 MPa.

5. The electromagnetic wave shielding material according to claim 1, wherein each metal layer has a thickness of 4 to 100 μm.

6. The electromagnetic wave shielding material according to claim 1, wherein each insulating layer has a thickness of 4 to 600 μm.

7. The electromagnetic wave shielding material according to claim 1, wherein a total thickness of the metal layer for shield and the metal layer for ground connection is 15 to 150 μm.

8. A coating material or exterior material for electric/electronic device, comprising the electromagnetic wave shielding material according to claim 1.

9. An electric/electronic device comprising the coating material or exterior material according to claim 8.

* * * * *